United States Patent [19]

Lammert

[11] Patent Number: 5,328,856
[45] Date of Patent: Jul. 12, 1994

[54] METHOD FOR PRODUCING BIPOLAR TRANSISTORS HAVING POLYSILICON CONTACTED TERMINALS

[75] Inventor: Michael D. Lammert, Manhattan Beach, Calif.

[73] Assignee: TRW Inc., Redondo Beach, Calif.

[21] Appl. No.: 937,329

[22] Filed: Aug. 27, 1992

[51] Int. Cl.$^5$ .................. H01L 21/265; H01L 29/70
[52] U.S. Cl. .................... 437/31; 437/162; 148/DIG. 11
[58] Field of Search ............... 437/31, 162; 148/DIG. 11

[56] References Cited

U.S. PATENT DOCUMENTS

| 4,577,397 | 3/1986 | Komatsu et al. | 437/31 |
| 4,933,295 | 6/1990 | Feist | 437/31 |
| 5,013,677 | 5/1991 | Hozumi | 437/31 |

FOREIGN PATENT DOCUMENTS 0076424  4/1988  Japan ..................... 437/31

*Primary Examiner*—Olik Chaudhuri
*Assistant Examiner*—Long Pham
*Attorney, Agent, or Firm*—Ronald L. Taylor

[57] ABSTRACT

This invention discloses a process by which a silicon bipolar transistor can be fabricated having a polysilicon emitter region and a polysilicon base region by a single polysilicon deposition step. After conventional fabrication of the substrate, collector and base layers, a first dielectric layer is deposited over the developing wafer structure. The first dielectric layer is then etched in order to define polysilicon emitter, base and collector regions. Next, a polysilicon layer is deposited over the first dielectric layer and the etched regions. A planarization layer is deposited over the polysilicon layer, and the planarization layer and the polysilicon layer are etched so that polysilicon only remains in the defined polysilicon emitter, base and collector regions. The polysilicon emitter, base and collector regions are then implanted with dopants to provide the appropriate interfaces. A second dielectric layer is deposited over the first dielectric layer and the polysilicon regions and is etched to open contacts to the polysilicon emitter, base and collector regions. A metallization layer is then deposited and etched to contact the polysilicon emitter, base and collector regions.

19 Claims, 2 Drawing Sheets

METHOD FOR PRODUCING BIPOLAR TRANSISTORS HAVING POLYSILICON CONTACTED TERMINALS

BACKGROUND OF THE INVENTION

1. Technical Field of the Invention

This invention relates generally to a method for fabricating silicon bipolar transistors having polysilicon contacted terminals and, more particularly, to a method for fabricating silicon bipolar transistors having a polysilicon emitter and a polysilicon contacted base which incorporates a single polysilicon deposition step.

2. Discussion of the Related Art

It is generally well understood in the art to incorporate polysilicon contact regions for one or all of the emitter, base and collector of a silicon bipolar transistor. Typically, it is more desirable for at least the emitter and base to have polysilicon contact regions. By utilizing these polysilicon contact regions, it is possible to develop silicon bipolar transistors of reduced dimensions having an acceptable parasitic capacitance, thus improving or maintaining the performance characteristics of the transistor. In particular, advances in the art have enabled production of silicon bipolar transistors having emitters which are very thin. By developing the emitter region of the transistor very thin, it is possible to provide an emitter which is almost entirely made up of polysilicon, therefore even further reducing the parasitic capacitance.

The prior art processes necessary to fabricate silicon bipolar transistors having polysilicon emitter regions and base contact regions for the most part have required complex deposition steps in addition to the complexity of fabricating silicon bipolar transistors without these regions. More specifically, the prior art methods generally require two or more polysilicon deposition steps due to the stringent requirements of emitter and base contact region thicknesses and the need to electrically separate the emitter contact region and the base contact region. Likewise, in advanced fabrication processes of complementary NPN and PNP silicon bipolar transistors on a common substrate, it has been necessary to provide a two or three step polysilicon deposition process to provide the polysilicon emitter and base regions for both of the devices.

The problems with fabricating bipolar transistors incorporating multiple polysilicon deposition steps are further highlighted in fabricating bipolar transistors with emitters having widths less than 0.5 microns. In the prior art devices, it was generally required that the polysilicon region of the emitter be insitu-doped in order to avoid narrow emitter effects in bipolar transistors having this type of emitter. This was a requirement due to the disparity in emitter width generated from a doping implantation step after the polysilicon had been deposited. Consequently, the requirement of insitu-doped polysilicon emitters maintained the need for separate polysilicon deposition steps for the emitter region and base contact region.

What is needed then is a bipolar transistor fabrication process which provides polysilicon emitter regions and base contact regions in which the polysilicon deposition process is simplified over the prior art bipolar transistor fabrication processes. It is therefore an object of the present invention to provide such a process.

SUMMARY OF THE INVENTION

This invention proposes fabrication of a silicon bipolar transistor in which a single polysilicon deposition step is performed to provide both a polysilicon contacted base and a polysilicon emitter. According to one preferred embodiment, the steps of fabricating a silicon bipolar transistor are performed by any bipolar transistor processing procedure up through the formation of the active base. Following these steps, an initial dielectric layer is deposited over the developing wafer structure. Next, inactive base, emitter and collector polysilicon regions are lithographically defined and etched in the dielectric layer by an etching process which does not damage the underlying single crystal silicon material.

Once these steps are completed, polysilicon is then deposited over the inactive base, emitter and collector regions, as well as over the remaining unetched dielectric layer. A planarization layer is then deposited over the polysilicon layer to provide an even surface. Complementary etching steps are then performed in order to etch the planarization layer and the polysilicon layer so that only polysilicon material remains within the previously defined inactive base, emitter and collector regions in the dielectric layer. Next, the just formed polysilicon regions are implanted with an appropriate dopant using a resist implant mask to define the appropriate p-type and n-type interface areas of the transistor. The outer surface of the polysilicon regions are then silicided. Finally, a subsequent dielectric layer is deposited over the initial dielectric layer and etched to open the polysilicon contact regions. A metallization layer is then deposited over the wafer structure and etched at the appropriate locations to provide metal emitter, base and collector contacts. The device can then be completed by conventional processing steps as is well known in the art.

Additional objects, advantages and features of the present invention will become apparent from the following description and appended claims, taken in conjunction with the accompanying drawings.

DETAILED DESCRIPTION OF THE PREFERRED EMBODIMENTS

The following discussion of the preferred embodiments concerning a fabrication process of a silicon bipolar transistor including a single polysilicon deposition step is merely exemplary in nature and is in no way intended to limit the invention or its application or uses.

Figure 1:
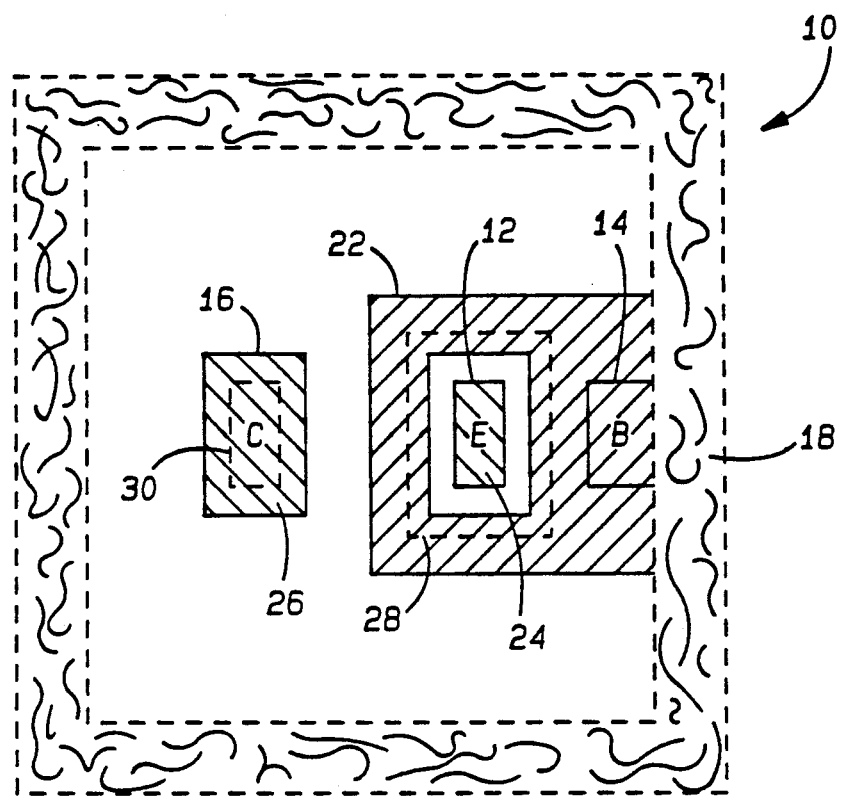
FIG. 1 is a top view of a silicon bipolar transistor having a polysilicon emitter and a polysilicon base contact region fabricated by a method according to one preferred embodiment of the present invention.

First turning to FIG. 1, a top view of an NPN silicon bipolar transistor 10 is shown having polysilicon contacted terminals. The bipolar transistor 10 includes an emitter contact 12, a base contact 14 and a collector contact 16 disposed as shown. It is noted, however, that other contact configurations are equally applicable for other transistor layouts without departing from the spirit and scope of the invention as will be discussed below. It is further noted that the discussion below will not particularly indicate specific device parameters such as doping concentrations, doping materials, layer thicknesses, etc., as these parameters can be conventional with respect to the invention.

The NPN transistor 10 is defined by an isolation region 18 which may be a p+ junction as indicated in FIG. 1, or a refilled trench, or any other isolation technique, as is well understood in the art. Additionally, polysilicon regions are shown in a hatched format in FIG. 1. More particularly, a polysilicon base region 22 is shown completely surrounding and electrically isolated from a polysilicon emitter region 24. It is noted that it is not necessary for the polysilicon base region 22 to surround the polysilicon emitter region 24. Devices with other configurations would include non-radiation hardened devices. A polysilicon collector region 26 is shown isolated from both the polysilicon base region 22 and the polysilicon emitter region 24. As is apparent, the polysilicon emitter region 24 is of substantially the same dimension as the emitter contact 12, and therefore, the polysilicon emitter region 24 can be considered a polysilicon emitter contact region. The polysilicon base region 22 is, on the other hand, larger than the base contact 14. Also shown is an active base region 28 and an active collector region 30. The discussion below will concern fabrication of the NPN bipolar transistor 10 as shown in FIG. 1 in a cross-sectional format, and thus, FIG. 1 will offer an alternate perspective to the fabrication process.

Figure 2:
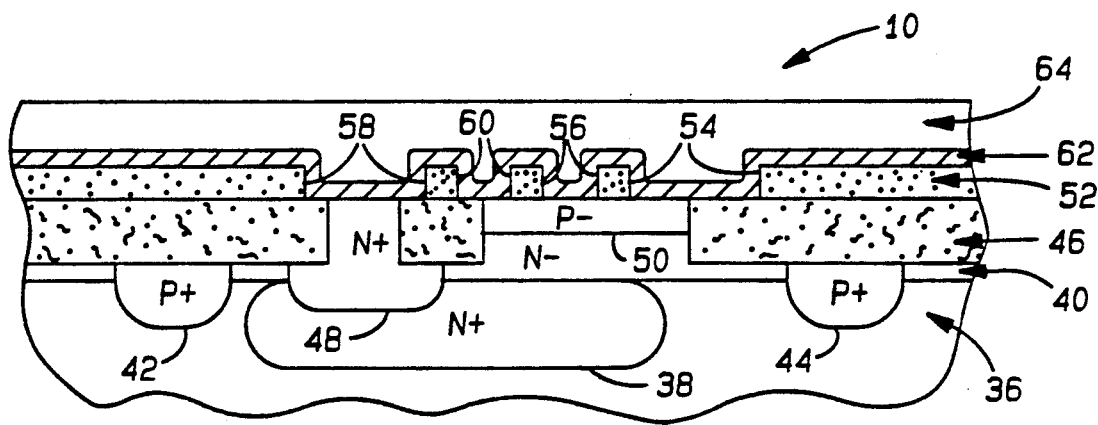
FIG. 2 is a cross-sectional view of an intermediate processing step of the silicon bipolar transistor of FIG. 1.

Now turning to FIG. 2, a cross-sectional view of the NPN bipolar transistor 10 is shown at an intermediate processing step during its fabrication process. Each layer of the transistor 10 is fabricated on a lightly doped p-type substrate 36. A heavily doped n-type buried collector region 38 is provided within the substrate 36 generally by any applicable diffusion procedure, as is well understood in the art. The buried layer 38 is diffused into the substrate 36 in vertical coordination with the active regions 28 and 30 of the transistor 10. Next, a lightly doped n-type epitaxial layer 40 is deposited over the substrate 36 and the buried layer 38, as shown. The epitaxial layer 40 is etched to define the active regions 28 and 30, as is well known in the art. Two heavily doped p-type regions 42 and 44 are shown extending through the epitaxial layer 40 into the substrate 38 as a cross-sectional depiction of the isolation region 18 in order to isolate the NPN transistor 10 from adjacent semiconductor devices (not shown). Additionally, a field oxide layer 46 is deposited as a first dielectric layer and planarized in the etched regions of the epitaxial layer 40 in order to minimize the parasitic capacitances of the transistor 10, as is also well understood in the art. Alternately, the field oxide layer 46 may be thermally grown and planarized.

The epitaxial layer 40 is diffused with a heavily doped n-type material in the active collector region 30 in order to provide a collector contact path 48 between the buried layer 38 and the collector contact 16. Next, a lightly doped p-type base layer 50 is formed at the base active region 28 of the transistor 10. The steps just discussed are conventional to the fabrication of a silicon bipolar transistor and therefore are discussed in only a cursory fashion. Other alternate methods are also well known and would be equally applicable to the fabrication steps of the invention discussed below.

Deposited over the field oxide layer 46, the contact path 48 and the base layer 50 is a second dielectric layer 52 as shown. The second dielectric layer 52 is of an appropriate insulative material, such as silicon dioxide, and is deposited by an appropriate deposition process such as chemical vapor deposition. The second dielectric layer 52 is lithographically patterned by a lithography process and etched to form a base region 54, an emitter region 56 and a collector region 58 by an etching process which does not damage the single crystal surface of the collector contact path 48 and the base layer 50. Note that region 60 is formed between the emitter region 56 and the collector region 58 by the etching process of the second dielectric layer 52. The region 60 is part of the base region 54 as can be realized by again viewing FIG. 1.

A polysilicon layer 62 is then deposited over the remaining portions of the second dielectric layer 52, the collector contact path 48 and the base layer 50 within the regions 54, 56, 58 and 60 by an appropriate deposition process such as chemical vapor deposition, as shown. Next, a planarization layer 64 is adhered to the polysilicon layer 62 to a desirable depth such that the upper surface of the planarization 64 is substantially flat.

Figure 3:
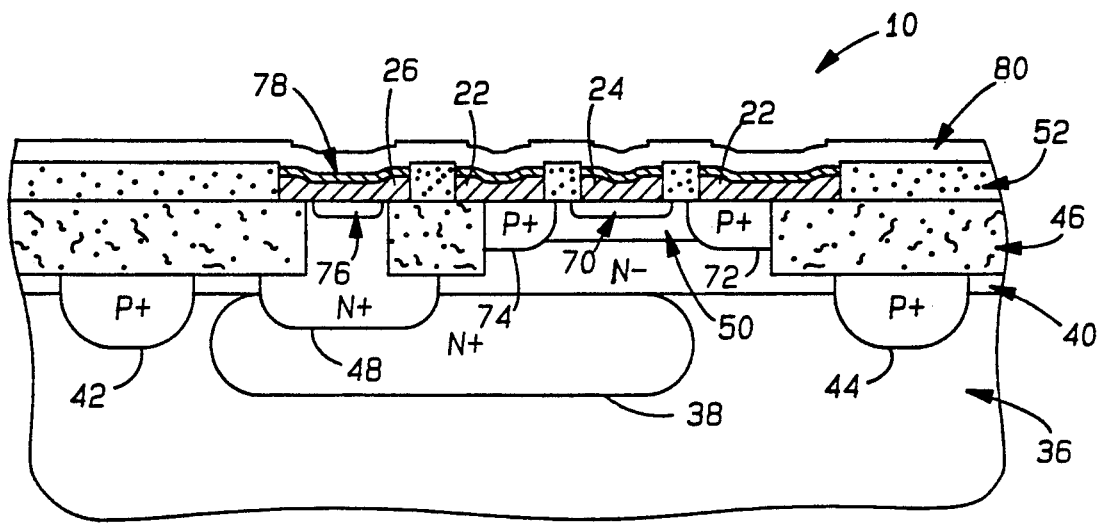
FIG. 3 is a cross-sectional view of a second intermediate processing step of the silicon bipolar transistor of FIG. 1.

The planarization layer 64 and the polysilicon layer 62 are then etched back by an appropriate two-step etching process until all of the planarization layer 64 is removed and the polysilicon layer 62 falls below the upper surface of the second dielectric layer 52 within each of the regions 54, 56, 58 and 60 to form the polysilicon regions 22, 24 and 26 as shown in FIG. 3. The first step of the etch consists of etching the planarization layer 64 until the elevated regions of the polysilicon layer 62 are exposed. The second step of the etch consists of etching the planarization layer 64 and the polysilicon layer 62 at a similar etch rate until the polysilicon layer 62 remains only in the etched regions of the dielectric layer 52.

Next, an appropriate mask (not shown) is configured relative to the top surface of the transistor 10 in order to implant desirable dopants into the polysilicon regions 22, 24, and 26 and into the single silicon crystalline material of the epitaxial layer 40, the base layer 50 and the collector contact path 48. This implantation step generates a heavily doped n-type region 70, heavily doped p-type base regions 72 and 74 and a heavily doped n-type region 76 in order to form desirable interfaces for the polysilicon regions 22, 24, and 26. As is apparent, the n-type region 70 forms a uniform thin emitter interface between the emitter region 26 and the base layer 50. Furthermore, the p-type regions 72 and 74 develop an appropriate interface between the base layer 50 and the polysilicon base region 24. Finally, the n-type region 76 develops an appropriate interface between the polysilicon collector region 26 and the collector contact path 48. Next, the top surface of the polysilicon regions 22, 24 and 26 are silicided to form a silicide layer 78 in order to lower the contact resistances for the emitter, base and collector polysilicon regions as is well understood in the art.

Figure 4:
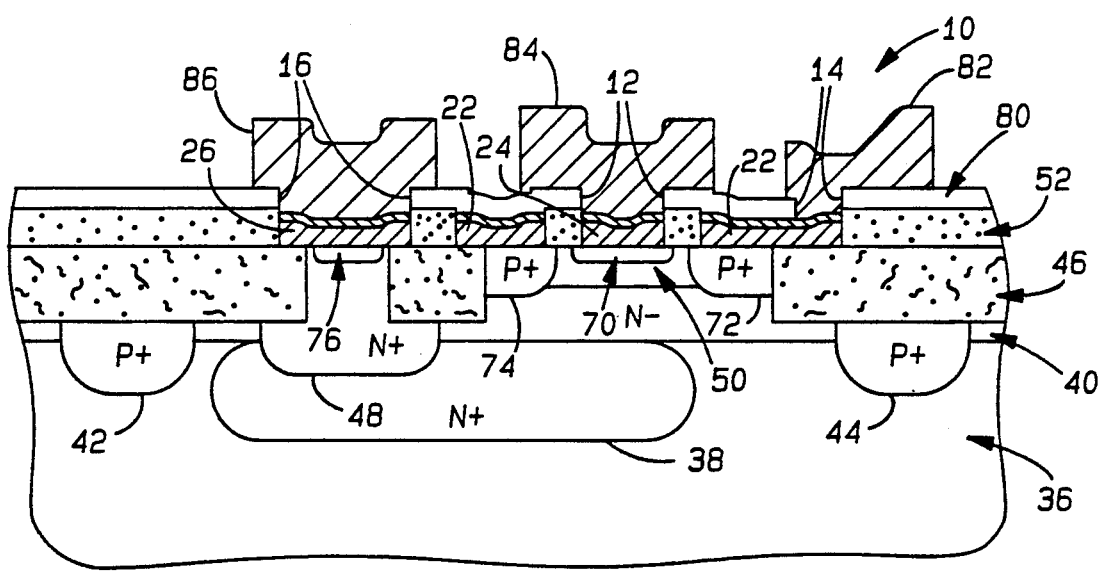
FIG. 4 is a cross-sectional view of a third intermediate processing step of the silicon bipolar transistor of FIG. 1.

Once the polysilicon regions have been fabricated as just described, a third dielectric layer 80 is deposited over the entire surface of the bipolar transistor 10 in order to provide a desirable contact to the polysilicon regions 22, 24 and 26 without directly short circuiting the different polysilicon areas. Looking specifically at FIG. 4, the third dielectric layer 80 is shown after it has been etched to open up the base contact region 14, the emitter contact region 12, and the collector contact region 16. Once the third dielectric layer 80 has been etched, a metallization layer is deposited over the NPN bipolar transistor 10 and patterned to form an emitter metal line 84, a base metal line 82, and a collector metal line 86. Subsequent processing steps can then be performed as required. Although not shown, the process discussed above also has direct applications for fabricating PNP transistors.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A method of fabricating a transistor comprising the steps of:
   providing a substrate;
   providing a semiconductor collector layer positioned relative to the substrate;
   providing a semiconductor base layer positioned relative to the semiconductor collector layer;
   providing a polysilicon layer positioned relative to the semiconductor base layer;
   providing a planarization layer in contact with the polysilicon layer opposite to the substrate; and
   etching the polysilicon layer and the planarization layer to define at least a polysilicon emitter contact region and a polysilicon base contact region.

2. The method according to claim 1 further comprising the steps of providing a first dielectric layer prior to providing the polysilicon layer, and etching holes in the first dielectric layer in order to define the polysilicon emitter region and the polysilicon base region in the first dielectric layer, wherein the step of providing a polysilicon layer includes proving the polysilicon layer over the first dielectric layer and within the holes etched in the first dielectric layer.

3. The method according to claim 1 wherein the step of etching the polysilicon layer and the planarization layer includes first etching the planarization layer until elevated regions of the polysilicon layer are exposed and then etching the remaining planarization layer and the polysilicon layer, and wherein the planarization layer and the polysilicon layer are etched to limit the polysilicon material to holes etched in a dielectric region which defines the polysilicon emitter contact region and the polysilicon base contact region.

4. The method according to claim 2 further comprising the steps of providing a second dielectric layer over the first dielectric layer and the polysilicon material within the polysilicon base region and the polysilicon emitter region, and etching the second dielectric layer in order to define contact areas to the polysilicon base region and the polysilicon emitter region.

5. The method according to claim 1 further comprising the step of doping the polysilicon emitter region and the polysilicon base region, wherein the dopant is diffused into the semiconductor base layer through the polysilicon emitter and base regions.

6. The method according to claim 1 further comprising the step of providing a field oxide layer prior to providing the base layer, said field oxide layer defining the base layer.

7. The method according to claim 1 further comprising the steps of depositing a metallization layer and etching the metallization layer such that a metallized emitter contact is in contact with the polysilicon emitter region and a metallized base contact is a contact with the polysilicon base region.

8. The method according to claim 3 further comprising the steps of siliciding the polysilicon regions.

9. The method according to claim 1 wherein the step of etching the polysilicon layer to form the polysilicon emitter region forms substantially an entire emitter region for the transistor.

10. The method according to claim 1 wherein the step of etching the polysilicon layer includes forming a polysilicon collector region.

11. A method of fabricating a silicon bipolar transistor comprising the steps of:
    providing a substrate;
    providing a semiconductor collector layer relative to the substrate;
    providing a semiconductor base layer in contact with the semiconductor collector layer;
    providing a first dielectric layer in contact with the semiconductor base layer;
    etching the first dielectric layer in order to define at least an emitter contact region and a base contact region;
    providing a polysilicon layer over the first dielectric layer, the emitter contact region and the base contact region;
    providing a planarization layer over the polysilicon layer; and
    etching the planarization layer and the polysilicon layer so that polysilicon material is limited to the etched regions of the first dielectric layer defining the emitter contact region and the base contact region so as to at least define a polysilicon emitter contact region and a polysilicon base contact region.

12. The method according to claim 11 further comprising the steps of providing a second dielectric layer over the first dielectric layer and the polysilicon base region and the polysilicon emitter region, and etching the second dielectric layer in order to provide contact areas to the polysilicon base region and the polysilicon emitter region.

13. The method according to claim 11 further comprising the step of doping the polysilicon emitter region and the polysilicon base region by diffusing dopants into the semiconductor base layer through the polysilicon emitter region and the polysilicon base region.

14. The method according to claim 11 further comprising the step of providing a field oxide layer prior to providing the base layer, said field oxide layer defining the base layer.

15. The method according to claim 11 further comprising the step of siliciding the polysilicon regions after the polysilicon layer has been etched.

16. The method according to claim 11 further comprising the steps of depositing and etching a metallization layer in order to provide metal contacts to the polysilicon emitter region and the polysilicon base region.

17. The method according to claim 11 wherein the step of etching the first dielectric layer includes defining a collector region, and wherein the step of etching the planarization layer and the polysilicon layer includes defining a polysilicon collector region.

18. The method according to claim 11 wherein the step of etching the planarization layer and the polysilicon layer to define the polysilicon emitter region forms substantially an entire emitter region for the transistor.

19. The method according to claim 11 wherein the step of etching the planarization layer and the polysilicon layer includes first etching the planarization layer until elevated regions of the polysilicon layer are exposed and then etching the remaining planarization layer and the polysilicon layer to define the polysilicon emitter region and the polysilicon base region.

* * * * *